United States Patent [19]

Van Dyke et al.

[11] Patent Number: 5,698,974
[45] Date of Patent: Dec. 16, 1997

[54] ROBUST GAUGE DRIVING CIRCUIT WITH PULSE MODULATED INPUT

[75] Inventors: Aaron Roger Van Dyke, Flint; Jeffrey Lynn Shepard, Lapeer; Frank J. Atherton, Goodrich; Michael Dennis Phalen, Davison; Raymond Lippmann, Ann Arbor; James Cary Mejeur, Grand Blanc; David Alan Ross, Columbiaville, all of Mich.

[73] Assignee: Delco Electronics Corporation, Kokomo, Ind.

[21] Appl. No.: 387,991

[22] Filed: Feb. 13, 1995

[51] Int. Cl.$^6$ ........................................ G01P 3/48
[52] U.S. Cl. ........................... 324/144; 73/866.3
[58] Field of Search ........................ 73/866.1, 866.3; 324/144, 146, 147; 310/36, 39; 318/9, 693, 695, 159, 160, 727, 757, 806

[56] References Cited

U.S. PATENT DOCUMENTS

| | | | |
|---|---|---|---|
| 3,832,628 | 8/1974 | Pottebaum | 324/76.82 |
| 4,371,834 | 2/1983 | Bezard et al. | 318/160 |
| 4,928,060 | 5/1990 | Ito | 324/144 |
| 5,004,976 | 4/1991 | Markow et al. | 324/144 |
| 5,309,087 | 5/1994 | Markow et al. | 324/146 |

Primary Examiner—Robert Raevis
Attorney, Agent, or Firm—Jimmy L Funke

[57] ABSTRACT

An input circuit for an automotive gauge driver receives a pulse width modulated or pulse frequency signal having a duty cycle representing a parameter to be displayed. A switching transistor controls an RC filter to develop an analog voltage proportional to the parameter. The input circuit biases the transistor to correctly respond to the input signal over a large range of supply voltage and where the ground potential differs from that of the source of the input signal. An output transistor means (or two) in series with a gauge coil (or two) is controlled by the analog voltage to provide coil current to effect linear gauge operation. Diodes in the input circuit limit the analog voltage range to end values which match the turn-on characteristics of the transistor means.

11 Claims, 2 Drawing Sheets

ROBUST GAUGE DRIVING CIRCUIT WITH PULSE MODULATED INPUT

FIELD OF THE INVENTION

This invention relates to a system for driving an automotive gauge and particularly to such a system using pulse modulated input signals.

BACKGROUND OF THE INVENTION

Usually automotive fuel gauges are driven by an analog signal from a variable resistance fuel level sender. The gauges comprise two or more field coils, one coil having a field current dependent on the analog signal, and another coil having current dependent only on system voltage, thereby producing a resultant field direction dependant on fuel level. A permanent magnet armature rotates to align with the field, and carries a pointer which indicates fuel level. Errors in such gauges are minimized during manufacture by adding a calibration resistor across one of the coils, the optimum calibration resistance being chosen for each manufacturing line of gauges. To prevent pointer response to sender variations due to fuel slosh in the tank, a viscous silicone fluid surrounds the armature to dampen armature movement. Calibration and testing of the gauges during manufacture is slowed by the damping since the gauges cannot respond rapidly to test signals.

Other types of automotive gauges (e.g. oil pressure, temperature) require less damping and can be tested more rapidly; thus a slightly different gauge structure is advantageous, although it results in a proliferation of gauges. Speedometers and tachometers employ still another kind of gauge movement to obtain a wide angle of pointer movement.

The source and type of input signal also has a bearing on the preferred style of gauge movement. Some gauge signals may be supplied by a microprocessor which is part of the instrument cluster and which responds to various input parameters from sensors in the vehicle, while others, like the analog fuel signal, are supplied directly to the gauge. In general, signals from microprocessors located in other parts of the vehicle are not successfully applied to the gauges in the instrument cluster since there are often significant differences in system power and ground voltages due to harness effects which lead to display errors.

The result of such an assortment of gauge requirements is a large number of different parts which must be manufactured, inventoried and assembled to the cluster, as well as many types of gauge drivers according to the type of sender signal and type of gauge.

Each of the gauges must also take into account sources of errors. Variations in ground voltage from place to place in the vehicle has already been mentioned. Large variations in battery voltage in a vehicle is a well known problem and may degrade the accuracy of the gauge. In the same way, temperature changes also affect gauge accuracy. It is also known to drive a gauge directly by a pulse width modulated (PWM) signal. However these gauges typically have electrical and audible noise.

The practice of driving instrument gauges by a microprocessor is becoming more common. Although it is a time honored practice to drive a fuel gauge directly from a fuel level sender, it is now found to be advantageous to electronically process the signal for the purpose of detecting fuel tank leaks. In that event, the analog signal is fed to an engine control microprocessor which makes a digital fuel signal available for gauge operation. The processed signal may then have the fuel slosh effect filtered out to relieve the gauge damping problem, but the differences in ground and supply voltages between the microprocessor and the instrument cluster remain.

SUMMARY OF THE INVENTION

It is therefore an object of the invention to drive an automotive gauge by a digital signal from any part of the vehicle to accurately display a vehicle parameter without vulnerability to ground and/or supply voltage offsets. Another object is to drive gauges in a manner not affected by temperature variations. Still another object is to use the same gauge movement for all instrument cluster gauges. Another object is to minimize the number of gauge driver types. Another object is to provide a simple, inexpensive, robust gauge driving circuit which is easy to manufacture and not influenced by substantial component tolerances. An additional object is to drive a gauge with a PWM signal without electrical and audible noise.

A gauge driving circuit is proposed which responds linearly to a pulse width modulated (PWM) signal or a pulse frequency modulated (PFM) signal having a duty cycle which varies in proportion to changes in fuel level or other vehicle parameter being displayed. Generally such a signal will be provided by a microprocessor or other electronic circuit which receives a raw parameter signal from a sensor. In the case of fuel level indication, a microprocessor is programmed to produce a PWM signal in response to the analog fuel sender voltage. In the case of a speedometer, the speed sensor typically generates a square wave signal varying in frequency with speed; such a signal may be electronically modified to issue short fixed width pulses at the frequency of the sensor to yield a duty cycle dependent on speed. The proposed driver circuit is particularly suited to gauges having a range of 90°.

An input circuit in the driver circuit receives the pulse modulated signal and generates an analog voltage which varies according to changes in the duty cycle; that is, the analog voltage is linear with respect to the input signal and the vehicle parameter it represents, and is also ratiometric relative to the supply voltage. The input circuit is supplied by a supply voltage and ground voltage available at the instrument cluster. An input transistor base is biased by a voltage divider to a value which assures that the transistor will be switched on and off by the input signal even though the source of the input signal has a substantially different supply and ground voltage. In practice the ground and supply voltages tend to vary by as much as two volts from system to system within the vehicle; the voltage divider resistors are selected to accommodate such variances. The transistor emitter and collector are connected in series with two diodes and a current limiting resistor across the supply and ground. A capacitor coupled via a resistor to one side of the transistor has a charging path through one diode and a discharging path through the other diode. The resistor/capacitor combination has a time constant which is large relative to the pulse modulation frequency so that an analog voltage is built up on the capacitor. The analog voltage varies substantially linearly with the pulse duty cycle and has a voltage range from one diode drop above ground to one diode drop below supply voltage. In the event the supply-to-ground voltage changes, the analog voltage will change accordingly.

An output circuit supplies current to gauge coils to effect pointer movement in proportion to changes in analog voltage. In one embodiment, a reference coil is supplied directly by the supply voltage and a control coil has current modulated by a transistor pair in response to the analog voltage to establish a resultant magnetic field which varies in direction according to the coil currents. A permanent magnet armature in the field aligns with the field to position the pointer according to the value of the analog voltage. Any variance in the supply voltage is reflected proportionately in the analog voltage so that the coil currents will be ratiometric and the field direction will not be affected.

Another gauge type has a similar gauge structure but both coils have controlled current. The output circuit for that gauge drives both coils, transistor pairs for the respective gauges responding inversely to changes in the analog voltage. As the analog voltage increases, the current in one coil increases and the current in the other coil decreases. Both currents change linearly with analog voltage change and the currents are ratiometric to afford immunity from supply voltage variations.

BRIEF DESCRIPTION OF THE DRAWINGS

The above and other advantages of the invention will become more apparent from the following description taken in conjunction with the accompanying drawings wherein like references refer to like parts and wherein.

DESCRIPTION OF THE INVENTION

The ensuing description is directed toward a gauge driver for fuel level indication but the benefits of the invention include its application to other auxiliary cluster gauges which have a 90° pointer range, including but not limited to gauges for oil pressure, engine coolant temperature, and battery voltage. A particular advantage of the invention is that all these gages can use the same driver circuit as well as the same gauge movement. Moreover, it has been found that a commercially available speedometer gauge movement is desirable for use as auxiliary gauges when the described driver is used, so that all the gauges in the cluster are the same. The speedometer and tachometer, however utilize a different driver circuit to obtain a wide angle of pointer sweep.

Figure 1:
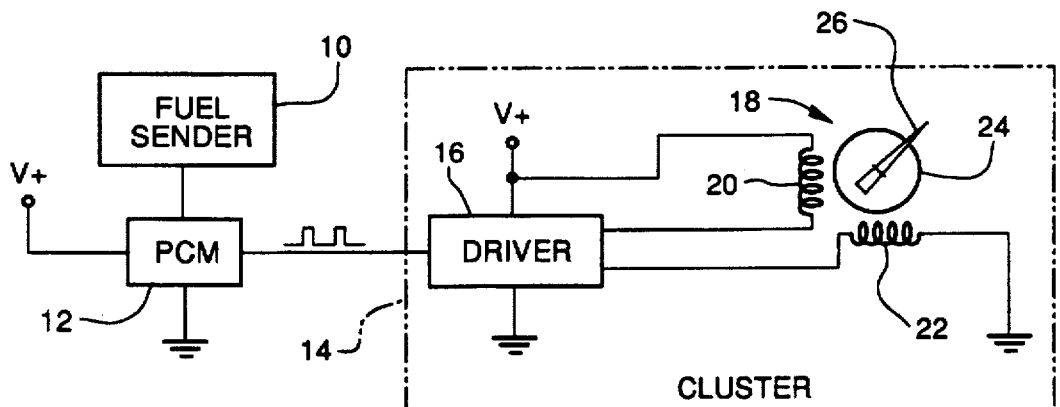
FIG. 1 is a schematic diagram of a gauge system for indicating a vehicle parameter according to the invention.

FIG. 1 illustrates a system for indicating fuel level having a fuel level sender 10 which issues an analog signal generally proportional to fuel level, a power control module 12 which receives the analog signal from the sender and in turn issues a PWM signal having a duty cycle which varies according to fuel level, an instrument cluster 14 including a driver circuit 16 responsive to the PWM signal and having two outputs for energizing a fuel gauge 18. The gauge includes two coils 20 and 22 arranged in quadrature for establishing a magnetic field, a permanent magnet armature 24 rotationally mounted in the field and positioned according to the relative coil currents, and a pointer 26 driven by the armature for indicating the fuel level. The respective coil currents are controlled by the two outputs of the driver circuit 16.

The power control module (PCM) 12 is a microprocessor based circuit which controls engine parameters and uses the fuel level signal to determine the event of fuel tank leakage; it also filters the signal to remove the effects of fuel slosh in the tank and generates a pulsed signal at a fixed frequency at a duty cycle which varies with the filtered fuel level signal. Alternatively, the pulsed signal could have a short fixed pulse and a frequency which depends on fuel level in order to afford the variable duty cycle. Both the power control module 12 and the cluster 14 are supplied by vehicle ignition voltage V+, but that voltage often has different values in the two locations. Similarly, the ground potential at one location may be quite different from the other. Other microprocessor circuits, including one in the cluster 14, or other circuits may supply the pulse modulated signal to the driver 16.

Figure 2:
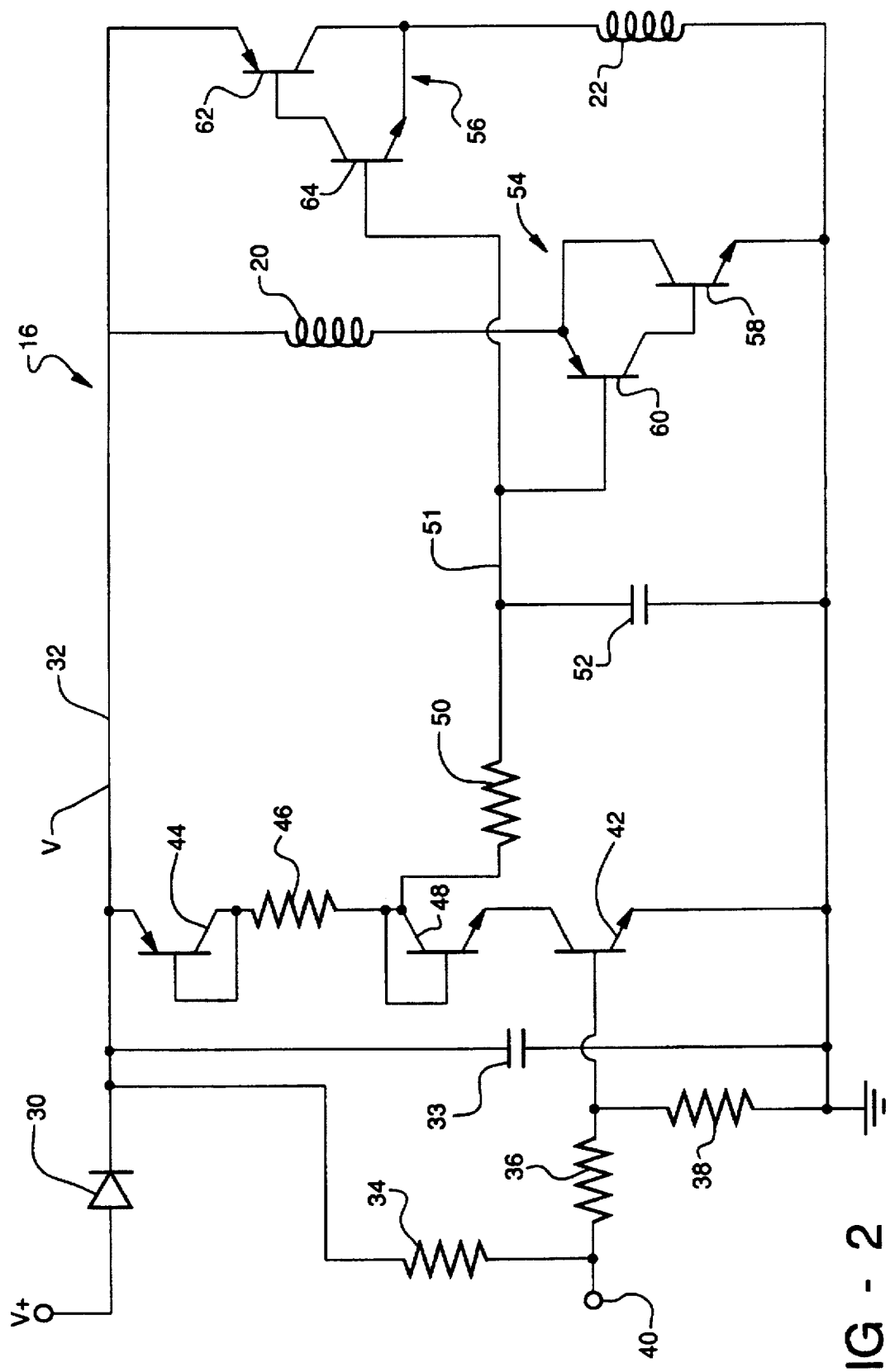
FIG. 2 is a circuit diagram of a driver circuit for the system of FIG. 1, according to the invention.

The driver circuit 16, shown in FIG. 2 along with gauge coils 20 and 22, is applicable where both coils are controlled; preferably both coils have substantially the same impedance. The driver circuit 16 is coupled through a diode 30 to the ignition voltage V+ to derive its supply voltage V on line 32. The diode 30 is used to prevent damage to circuits during large reverse transients. Also, the diode 30 is used with a capacitor 33 connected between the line 32 and ground to filter out the effects of short negative transients. An input circuit includes a voltage divider comprising resistors 34, 36 and 38 serially connected between the supply voltage V and ground. The junction of resistors 34 and 36 comprises the input terminal 40 of the driver. The junction of resistors 36 and 38 is connected to the base of a switching transistor 42. The input circuit further includes a series circuit containing a diode-connected pnp transistor (or diode) 44, a current limiting resistor 46, a diode-connected npn transistor (or diode) 48, and the switching transistor 42 connected between the supply voltage line 32 and ground. The junction of the current limiting resistor 46 and the transistor 48 is connected through a resistor 50 to a line 51 coupled to one side of a capacitor 52, the other side being connected to ground. This input circuit develops on capacitor 52 and line 51 an analog voltage which is a substantially linear representation of the duty cycle of the input signal. When the transistor 42 is switched off, the capacitor 52 is charged from the supply line 32 through the diode 44, and the resistors 46 and 50. When the transistor 42 is switched on, the capacitor discharges through the resistor 50, diode 48 and transistor 42. The ratio of on to off time, the values of resistors 46 and 50, the leakage currents from transistor pairs 54 and 56, the supply voltage V, and the diode drops determine the analog voltage on line 51.

The time constant of the resistor 50 and capacitor 52 is sufficient to filter the pulsed input over a large frequency range and to yield an analog signal with small ripple. For example, the resistor 50 may be 10 kohm and the capacitor 52 may be 10 μf. The current limiting resistor 46 is made an order of magnitude smaller than the resistor 50 to minimize non-linearity in the analog signal. The resistor 46 is, for example, 750 ohms, and is sufficient to prevent large current flow during conduction of the transistor 42. The input resistors 34 and 38 are 2.7 kohms and the resistor 36 is 10 kohms, for example.

In operation, assuming the pulsed input signal effectively alternates between ground potential of the PCM 12 and an open circuit condition, the base of the switching transistor 42 will be substantially at either its local ground potential to turn off or at a voltage determined by the divider 34, 36, 38 to drive the transistor 42 to saturation. Even if the PCM ground is as much as 2 volts above the cluster ground, the transistor base will be at about 0.2 volts to hold off the transistor 42 at the low portion of the input signal. At the high portion of the input signal, the 0.7 volts base-emitter voltage is exceeded even for a supply voltage V as low as 5 volts. Thus the input circuit is immune to large variances of ground voltage and of supply voltage. For PWM operation it is proposed to operate at a pulse frequency of 512 Hz. Circuit testing has shown that the circuit operates satisfactorily at frequencies from 128 Hz to 10 kHz. Thus frequency variations do not affect PWM operation, and the large frequency range makes pulse frequency operation suitable as well.

The output circuit of the driver 16 comprise gauge current control circuits including first and second complementary transistor pairs 54, 56, each serially connected with one of the gauge coils 20, 22 between the supply voltage and ground and having its control terminal coupled to the capacitor 52 and controlled by the analog voltage. The coil 20 has one side connected to supply line 32 and the other connected through the pair 54 to ground. The transistor pair 54 includes an npn transistor 58 having its collector and emitter connected between the coil 20 and ground, and its base driven by a pnp transistor 60 which, in turn, is controlled by the analog voltage on the capacitor 52. As the analog voltage decreases from a high value, the transistor pair increases current flow in the coil 20. The coil 22 has one side connected to ground and the other connected through the pair 56 to supply line 32. The transistor pair 56 includes a pnp transistor 62 having its collector and emitter connected between the supply line 32 and the coil 22, and its base driven by an npn transistor 64 which, in turn, is controlled by the analog voltage on the capacitor 52. As the analog voltage decreases from a high value, the transistor pair 56 decreases current flow in the coil 22. The transistors 44 and 48 configured as diodes set limits on the analog voltage which substantially match the voltages required to begin conduction in the respective transistor pairs 54 and 56 so that just as the input signal duty cycle departs from either end point (0% or 100%) one of the coil current will begin to increase.

Figure 3:
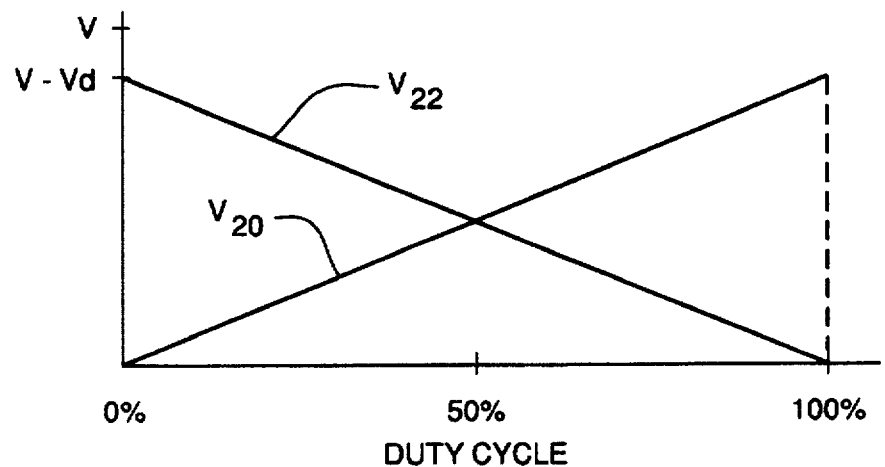
FIG. 3 is a diagram of coil voltages resulting from the driver circuit of FIG. 2.

In operation, the output circuit yields voltages V20 and V22 across coils 20 and 22, respectively, as shown in FIG. 3, one increasing and the other decreasing as the duty cycle of the input signal changes. The two voltages are essentially equal at 50% duty cycle. The dynamic range of the capacitor voltage runs from a diode drop above ground, where the pair 56 begins to conduct, to a diode drop below supply voltage V where the pair 54 begins to conduct. Thus each coil is supplied with voltage from zero to a maximum 30 value, varying substantially linearly with duty cycle. The maximum value is shown as the supply voltage V less a diode drop Vd. Each coil current is a function of the supply voltage, but the currents are ratiometric over a very wide range of supply voltages and the gauge pointer position is thus not influenced by variances in the supply or ground voltage. The linear voltage graphs of FIG. 3 hold true for 14 volts, 8 volts or even 5 volts, the only change being the scale values.

Testing of the circuit has proven its robustness. In addition to its immunity to frequency variation, supply voltage variations and voltage differences with respect to the source of the modulated input signal, it also is not significantly affected by temperature variations or component tolerances. Component tolerance of 10% allows inexpensive manufacture while yielding reliable and predictable ratiometric outputs. Any vehicle parameter can be displayed using this circuit when its value is expressed as a duty cycle of a pulse modulated signal by a microprocessor or other circuit. All auxiliary gauges can use the same circuit to indicate temperature, fuel level, oil pressure, etc. They can also use the same gage movement as the speedometer and tachometer.

Figure 4:
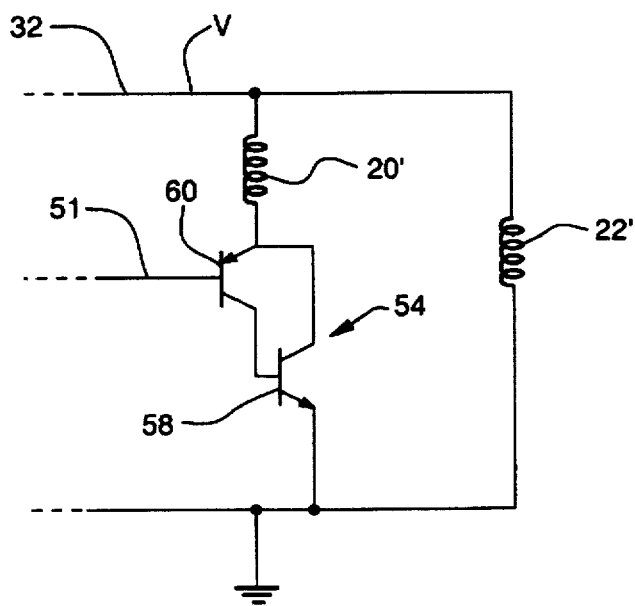
FIG. 4 is a circuit diagram showing the output circuit of another driver circuit embodiment for the system of FIG. 1, according to the invention.

Another type of gauge movement having a reference coil and a control coil is driven by a variation of the driver circuit of FIG. 2. Instead of driving the currents of two coils in accordance with the input signal, only one coil voltage is varied and the reference coil is supplied without control by the supply voltage. The circuit differs from that of FIG. 2 in that the transistor pair 56 and the corresponding transistor 48 are omitted. The output circuit is shown in FIG. 4. There the control coil 20' and the transistor pair 54 are connected serially between the supply line 32 and ground, while the reference coil 22' is connected directly between the supply line 32 and ground. There the coil currents are ratiometric, varying in the same proportion when the supply voltage V changes. Thus the field of the control coil 20' is determined by the analog voltage on line 51, and the gauge pointer movement depends solely on that variable, the field of coil 22' being ratiometric. The FIG. 4 driver circuit embodiment exhibits increased system tolerance; that is, as applied to many individual gauges, it yields a greater variance of pointer position at the extremes of the gauge range than the FIG. 2 embodiment. However it is still useful where that style of gauge is desired and has the benefits of low cost, linearity and robustness which characterize the FIG. 2 embodiment.

The embodiments of the invention in which an exclusive property or privilege is claimed are defined as follows:

1. In a gauge responsive to a pulsed input signal having a variable duty cycle representing a parameter to be displayed, including first and second field coils, a driving circuit for energizing the coils, an armature responsive to fields produced by the coils, and a pointer driven by the armature, said driving circuit comprising:

an input circuit for receiving the input signal and producing an analog signal in accordance with the duty cycle of the input signal;

a power source coupled to the coils for supplying current to the coils, the power source having a supply line and a ground;

a first current control circuit responsive to the analog signal and coupled to the first coil for increasing current in the first coil with increasing duty cycle, the first current control circuit comprising a first transistor means coupled between the supply line and one side of the first coil, the other side of the first coil being connected to ground, and the first transistor means having a control electrode coupled to the analog signal; and a second current control circuit responsive to the analog signal and coupled to the second coil for decreasing current in the second coil with increasing duty cycle, the second current control circuit comprising a second transistor means coupled between ground and one side of the second coil, the other side of the second coil being connected to the supply line, and the second transistor means having a control electrode coupled to the analog signal;

whereby the field strength of one coil changes contrary the change of field strength of the other coil.

2. The invention as defined in claim 1 wherein the input circuit includes means for producing an analog signal which changes linearly with changes in duty cycle of the input signal.

3. The invention as defined in claim 1 wherein:

the first and second field coils have substantially the same impedance; and the first and second current control circuits change the currents in the respective coils linearly with change of duty cycle of the input signal, whereby the armature rotation is substantially linearly responsive to the duty cycle of the input signal.

4. The invention as defined in claim 1 wherein each transistor means comprises a complementary transistor pair.

5. In a gauge responsive to a pulsed input signal having a variable duty cycle representing a parameter to be displayed, an indicator movement for positioning a pointer in response to the input signal, a driver circuit for energizing the indicator movement comprising:

a voltage supply;

an input circuit for receiving the input signal and producing an analog signal in accordance with the duty cycle of the input signal comprising, a switch responsive to the input signal having different states for on and off intervals of the input signal, a capacitor coupled to the switch for developing the analog voltage, a first resistive path from the voltage supply to the switch for charging the capacitor during a first state of the switch, a second resistive path from the capacitor to ground for discharging the capacitor during a second state of the switch, and the resistance values of the resistive paths being selected for effecting linear changes of analog voltage with changes in duty cycle; and an output circuit connected to the indicator movement and the input circuit and responsive to the analog voltage for supplying energizing current to the indicator movement.

6. The invention as defined in claim 5 including means for setting limits on the range of analog voltage produced by the input circuit comprising:

a first diode in the first resistive path for limiting the maximum analog voltage to a fixed value below the supply voltage; and a second diode in the second resistive path for limiting the minimum analog voltage to a fixed value above ground.

7. The invention as defined in claim 5 wherein the indicator movement comprises a first field coil connected to receive a current dependent only on supply voltage, a second field coil connected to the driver circuit for energization according to the analog voltage, and an magnetic armature responsive in position to the fields of the coils.

8. The invention as defined in claim 5 wherein the indicator movement comprises two field coils connected to the driver circuit for energization according to the analog voltage, and an armature responsive to field coil energization.

9. In a gauge responsive to a pulsed input signal having a variable duty cycle representing a parameter to be displayed, including first and second field coils, a driving circuit for energizing the coils, an armature responsive to fields produced by the coils, and a pointer driven by the armature, said driving circuit comprising:

an input circuit for receiving the input signal and producing an analog signal in accordance with the duty cycle of the input signal, wherein the duty cycle is variable between first and second limits;

a power source coupled to the coils for supplying current to the coils;

a first current control circuit responsive to the analog signal and coupled to the first coil for increasing current in the first coil with increasing duty cycle; and a second current control circuit responsive to the analog signal and coupled to the second coil for decreasing current in the second coil with increasing duty cycle; whereby the field strength of one coil changes contrary the change of field strength of the other coil;

wherein the analog signal is varied by the input circuit between high and low limits corresponding to the first and second limit of the duty cycle; and the input circuit includes means for setting the high and low limits of the analog signal equal to the high and low values, respectively, of the dynamic voltage range.

10. In a gauge responsive to a pulsed input signal having a variable duty cycle representing a parameter to be displayed, including first and second field coils, a driving circuit for energizing the coils, an armature responsive to fields produced by the coils, and a pointer driven by the armature, said driving circuit comprising:

an input circuit for receiving the input signal and producing an analog signal in accordance with the duty cycle of the input signal;

a power source coupled to the coils for supplying current to the coils;

a first current control circuit responsive to the analog signal and coupled to the first coil for increasing current in the first coil with increasing duty cycle; and a second current control circuit responsive to the analog signal and coupled to the second coil for decreasing current in the second coil with increasing duty cycle, wherein the first and second current control circuits are operative over a dynamic voltage range between high and low values, whereby the field strength of one coil changes contrary the change of field strength of the other coil; and wherein the input circuit includes a capacitor, capacitor charging and discharging means, a switch responsive to the input signal for controlling charging and discharging to produce the analog signal, and means for limiting the analog signal to the dynamic voltage range.

11. In a gauge responsive to a pulsed input signal having a variable duty cycle representing a parameter to be displayed, including first and second field coils, a driving circuit for energizing the coils, an armature responsive to fields produced by the coils, and a pointer driven by the armature, said driving circuit comprising:

an input circuit for receiving the input signal and producing an analog signal in accordance with the duty cycle of the input signal;

a power source coupled to the coils for supplying current to the coils;

a first current control circuit responsive to the analog signal and coupled to the first coil for increasing current in the first coil with increasing duty cycle; and a second current control circuit responsive to the analog signal and coupled to the second coil for decreasing current in the second coil with increasing duty cycle, whereby the field strength of one coil changes contrary the change of field strength of the other coil; and wherein supply voltage produced by the power source is subject to voltage variations, and voltage and current applied to the coils are dependent on the supply voltage, and means for controlling the armature independently of the voltage variation, said means comprising each current control circuit and its corresponding coil being serially connected across the supply voltage, whereby the coil currents are ratiometric so that the resultant field direction and thus the armature position is independent of the supply voltage.

* * * * *